United States Patent
Das (10) Patent No.: US 8,319,554 B1
(45) Date of Patent: Nov. 27, 2012

(54) AMPLIFIER WITH START-UP COMMON MODE FEEDBACK

(75) Inventor: Abhijit Kumar Das, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/110,750

(22) Filed: May 18, 2011

(51) Int. Cl.
*H03F 3/45* (2006.01)

(52) U.S. Cl. .................. 330/258; 330/260; 330/261

(58) Field of Classification Search ........... 330/253–261
See application file for complete search history.

(56) References Cited

U.S. PATENT DOCUMENTS 6,388,522 B1 * 5/2002 Fattaruso et al. ............. 330/258

OTHER PUBLICATIONS

Ajay Kumar and Krishnaswamy Nagaraj, "Common-Mode Feedback Amplifier", U.S. Appl. No. 12/901,082, filed Oct. 20, 2010, pp. 1-50.

* cited by examiner

*Primary Examiner* — Khanh V Nguyen
(74) *Attorney, Agent, or Firm* — John E. Pessetto; W. James Brady; Frederick J. Telecky, Jr.

(57) ABSTRACT

An amplifier with a cascode device contains a common mode feedback circuit to ensure correct operating point in the amplifier. Common mode feedback is provided to the amplifier to maintain the common mode operating point during active operation. Additional common mode feedback is provided to the cascode devices to ensure correct start-up by forcing the node voltages to go to their desired voltage levels.

9 Claims, 6 Drawing Sheets

AMPLIFIER WITH START-UP COMMON MODE FEEDBACK

FIELD OF THE INVENTION

This invention generally relates to amplifiers, and more particularly to preventing incorrect start-up of an amplifier.

BACKGROUND OF THE INVENTION

Start-up problems are very common in amplifiers, especially where the input signal common mode is not well driven. This may cause the amplifier to stay in an incorrect operating point, causing significant or even complete performance loss. Start-up problems may result from different charging rates for various internal nodes that may result in the amplifier locking up when first turned on instead of settling into an expected quiescent state. Almost every differential amplifier includes a common mode feedback circuit. This feedback circuit includes a separate small amplifier and tries to ensure the operating voltages of different nodes in the main amplifier are at their desired levels.

Typical existing solutions to the start-up problem may use a start-up circuit, but sometimes it interferes with normal circuit operation. Some start-up circuits may need external digital control to turn them on and off. Sometimes a start-up circuit is not sufficient to ensure correct start-up across process and temperature variations. In that case, it may need to be overdesigned but then may cause performance degradation as it starts interfering with normal operation. 100% common mode feedback may ensure start-up, but achieving stability is difficult and may be nearly impossible in many situations. While 100% common mode feedback may ensure start-up, lack of stability can cause unwanted oscillations and total performance failure in amplifier operation.

BRIEF DESCRIPTION OF THE DRAWINGS

Particular embodiments in accordance with the invention will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Start-up problems are very common in amplifiers, especially input stages where the input signal common mode is not well driven. This may cause the amplifier to stay in an incorrect operating point, causing significant or occasional complete performance loss. Start-up problems may result from different charging rates for various internal nodes that may result in the amplifier locking up when first turned on instead of settling into an expected quiescent state.

A cascode amplifier is a two-stage amplifier that has a transconductance amplifier followed by a current buffer. Compared to a single amplifier stage, this combination may have one or more of the following characteristics: higher input-output isolation, higher input impedance, high output impedance, higher gain or higher bandwidth. The cascode amplifier is often constructed from two transistors (BJTs or FETs), with one operating as a common emitter or common source and the other as a common base or common gate. The cascode improves input-output isolation (or reverse transmission) as there is no direct coupling from the output to input. This eliminates the Miller effect and thus contributes to a much higher bandwidth.

A common mode feedback structure is almost always present in a differential amplifier. The job of the common mode feedback structure is to ensure correct operating voltage at every node of the amplifier. But due to several reasons, existing prior art implementation methods often fail to ensure correct operating point voltages at every node of the amplifier causing incorrect start-up and total performance loss. This problem can be solved by providing additional common mode feedback through a cascode device. As will be described in more detail below, this is implemented in a way such that the feedback through the cascode device is only in effect if there is a start-up failure or incorrect operating point condition. This provides a failsafe solution which does not interfere with the amplifier performance.

Figure 1:
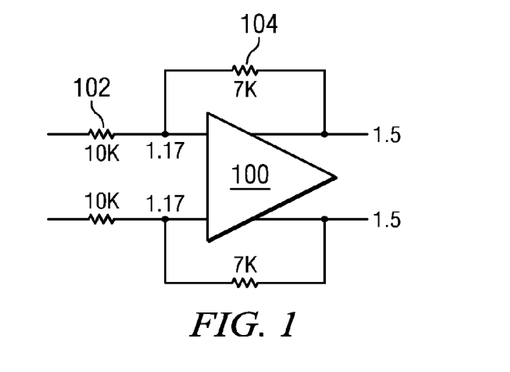
FIG. 1 is a schematic illustrating an exemplary amplifier which had a successful start-up and is under normal operation with proper input and output operating point voltages.

FIG. 1 is a schematic illustrating an exemplary differential amplifier 100 that is designed to operate with a power source of 1.5 volts. It is biased to operate at a 0.7 volt common mode voltage at the output and a 0.7 volt common mode voltage at the input. On one side, input resistor 102 and feedback resistor 104 establish a balanced amplifier input and output of 0.7 volts when an input voltage of 0.7 volts is applied to input resistor 102. The other side is configured similarly. In this normal quiescent operating mode, there is no feedback current flowing in feedback resistor 104. This amplifier embodies the new common mode feedback structure to ensure failsafe operation.

Figure 2:
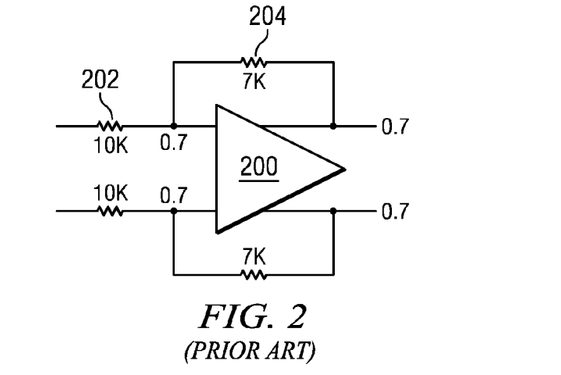
FIG. 2 illustrates a potential erroneous operating point for an amplifier after improper start-up causing the operating points to shift significantly from their desired position.

FIG. 2 illustrates a potential erroneous operating point for amplifier 200 that might occur during start-up. Amplifier 200 is similar to amplifier 100 but does not include the new common mode feedback scheme to provide failsafe start-up. In this particular example, both sides of the output stage are stuck at the 1.5V power rail due to an erroneous start-up. The amplifier input settles at 1.17 volts as determined by current flowing through feedback resistor 204 and input resistor 202 when a nominal input common mode voltage of 0.7 volts is applied to input resistor 202, as can be determined by solving the node equation for the circuit. This is a stable operating point, but in this condition the operation of the amplifier is impaired and it may be completely non-functional.

Figure 3:
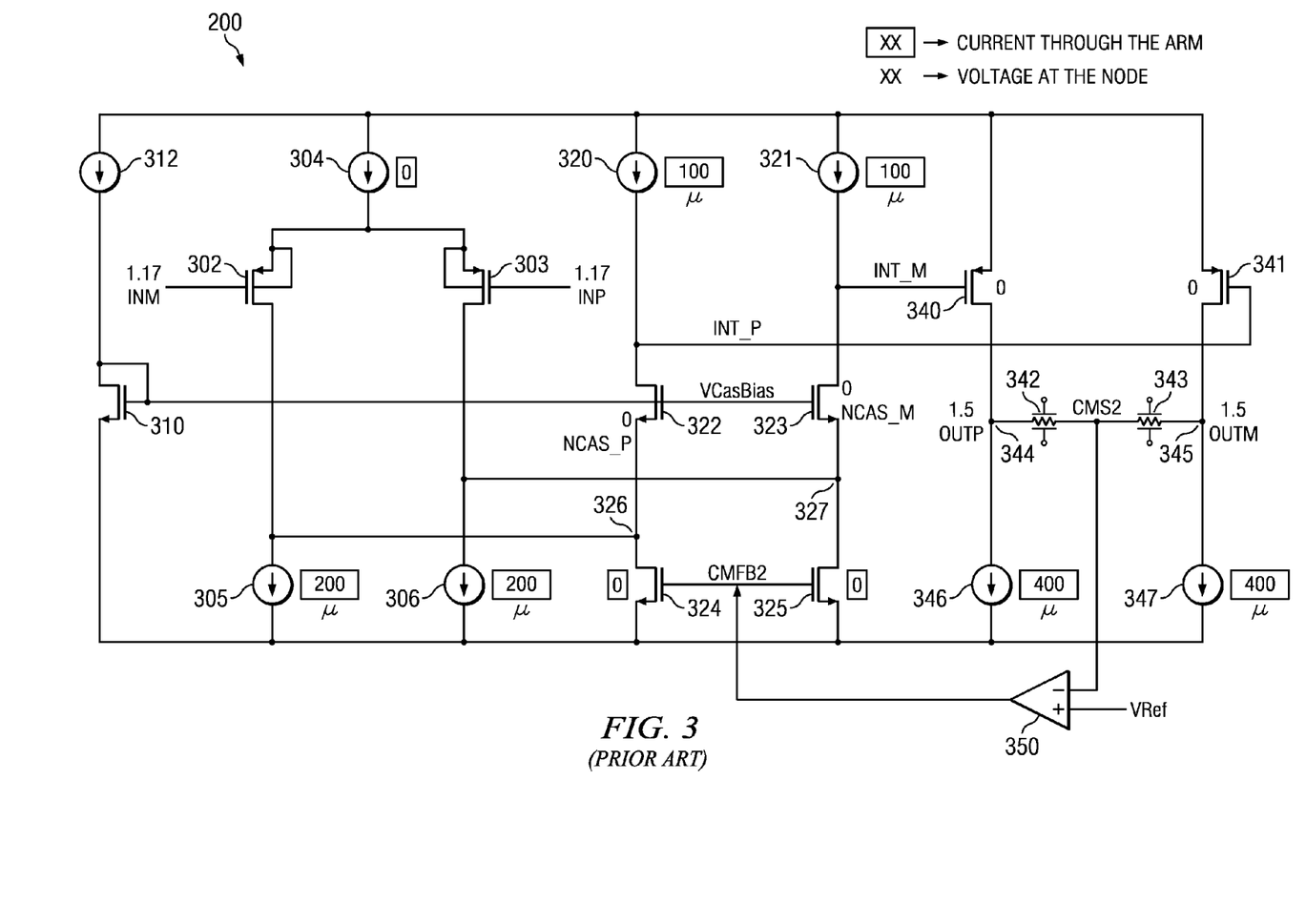
FIG. 3 illustrates a failure mechanism for the amplifier of FIG. 2 with a typical prior-art common mode feedback topology.

FIG. 3 illustrates a failure mechanism for prior art amplifier 200. Amplifier 200 is a differential amplifier that operates on 1.5 volts. It is biased to have a normal common mode operating point of 0.7 volts. Amplifier 200 includes a first stage in which PMOS devices 302, 303 steer current from current source 304 to current sinks 305, 306 in response to differential input voltage signals INM and INP, respectively. Current sinks 305, 306 are set to 200 ua in this example. A cascode configuration has NMOS cascode devices 322, 323 connected respectively to input stage devices 302, 303 and NMOS common mode feedback devices 324, 325. Current sources 320, 321 are set at 100 ua in this example and provide the current to cascode devices 322, 323. NMOS cascode bias device 310 is gate connected to cascode devices 322, 323 and thereby controls the operation of cascode devices 322, 323. A second stage has PMOS devices 340, 341 connected to current sinks 346, 347 that are set to 400 ua in this example. Intermediate signals INT_M and INT_P are respectively coupled to the gates of output devices 340, 341.

A common mode signal CMS2 is developed by averaging the voltage at node OUTP & OUTM using the resistors 342, 343. It is compared against reference voltage VREF by another differential amplifier 350 that generates a common mode feedback signal CMFB2 that is coupled to the gates of common mode feedback devices 324, 325. VREF is set to 0.7 volts in this example, which is the expected common mode operating point. In this example the common mode feedback structure comprises elements 324, 325, 350, 342, 343 and attempts to maintain the operating point of amplifier 200 centered about the reference voltage VREF.

As mentioned above, in this example according to the node equations there is a stable operating point at 1.17 volts on the amplifier input when the output voltage is pulled to the 1.5 volt supply rail. Depending on the amplifier configuration, there may also be a stable operating point when the output voltage is erroneously pulled to the 0.0 volt supply rail. In these situations, the amplifier may lock up and have a complete performance failure.

With an input voltage of 1.17 volts on the gates of device 302 and 303, devices 302 and 303 are cutoff and current flow is zero through current source 304. Current sources 305, 306 are set to sink 200 ua; however, since devices 302 and 303 are cutoff this current is attempted to be taken from current sources 320, 321 via cascode devices 322, 323. Since current sources 320, 321 only provide 100 ua in this example, the voltage on nodes 326, 327 drops to essentially zero volts.

As NCAS_P and NCAS_M nodes 326, 327 drop to approximately zero volts, cascode devices 322, 323 become over-biased and turn on hard. As a result, control signals INT_M and INT_P have a low voltage and output devices 340, 341 are turned fully on, pulling outputs OUTP and OUTM to the 1.5 v supply rail. Common mode signal CMS2 will likewise rise to about 1.5 v and common mode feedback signal CMFB2 will be driven to a low voltage turning common mode feedback devices 324, 325 off in an attempt to reduce current passing through devices 324, 325 and thereby increasing the node voltage of NCAS_P and NCAS_M. However this has no effect since in this situation the current through devices 324, 325 is already zero as devices 305 and 306 sink the complete current available and pull down the drain voltage for devices 305, 306.

One way to avoid this problem is to increase the current supplied by current sources 320, 321 to more than 200 uA. This provides enough current so that current sinks 305, 306 don't hog all of the cascode current and drive cascode devices 322, 323 to zero volts. However, this increases the power dissipation of amplifier 200. During normal operation of amplifier 200 there is no need for a larger current source, so the extra power would just be wasted. During normal operation, this extra current through device 320, 321 has to pass through feedback devices 324, 325. This increase in current degrades the stability of the common mode feedback system. The degraded stability can potentially cause unwanted oscillation or complete performance failure of the overall amplifier 200.

Figure 4:
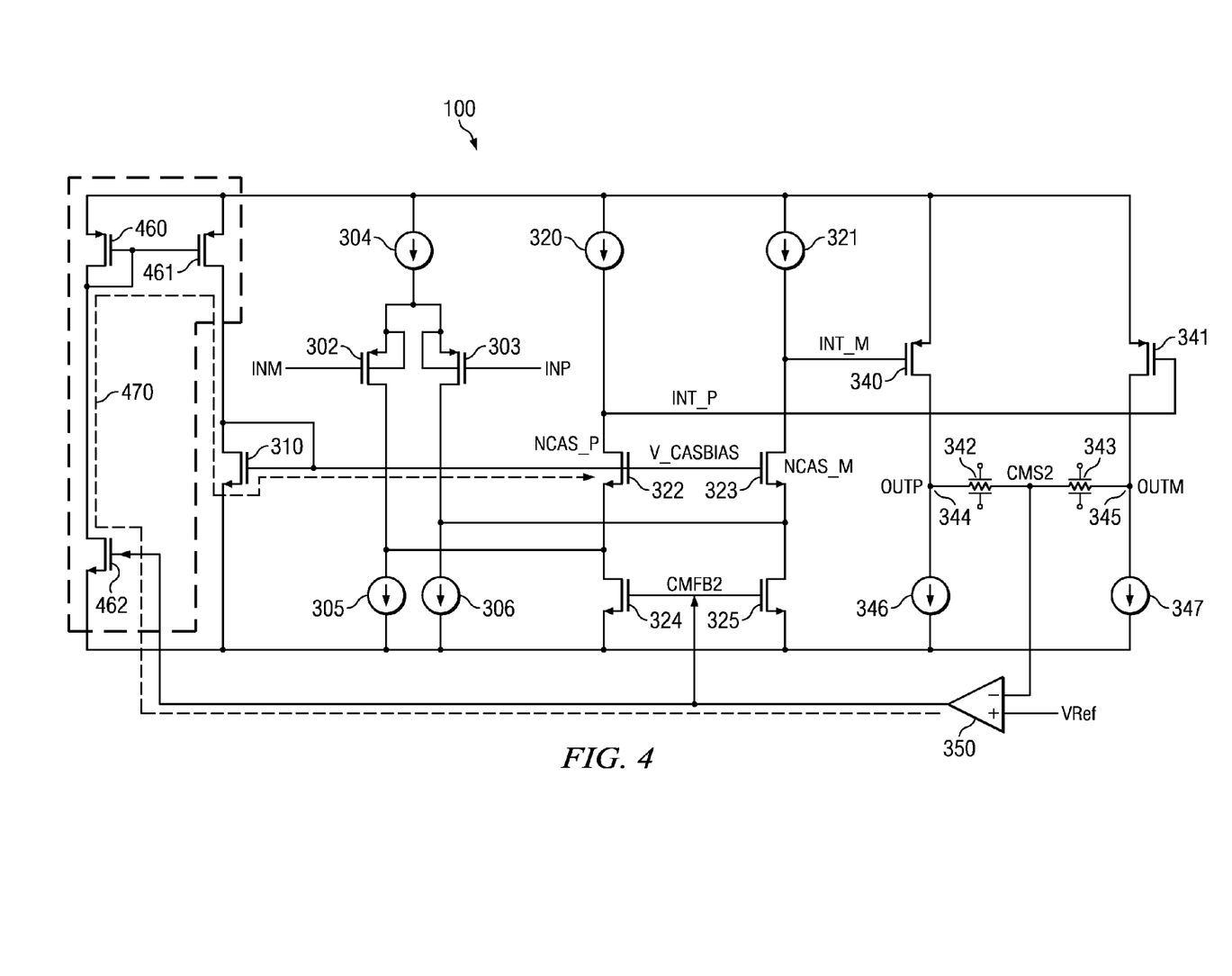
FIG. 4 illustrates an improved common mode feedback architecture through the cascode devices.

FIG. 4 is a schematic of amplifier 100 that illustrates an improved failsafe common mode feedback circuit to the cascode devices that consumes no additional operating power and reliably prevents start up failures. Amplifier 100 is essentially the same as amplifier 200 with the addition of common mode feedback through cascode device 322, 323 controlled by common mode feedback signal CMFB2. Common mode bias devices 460-462 form a current source that provides current to cascode bias device 310 which in turn provides gate bias for cascode devices 322, 323. This allows the common mode feedback signal CMFB2 to have control over all of the current provided by current sources 320, 321 and thereby manage control signals INT_P and INT_M and output devices 340, 341 during start-up anomalies.

During start-up, if common mode signal CMS2 gets stuck at 1.5V due to output devices 340, 341 erroneously saturating as described in the above example, then as in the previous example the common mode feedback amplifier 350 tries to reduce the voltage at node CMFB2 in an attempt to reduce current through devices 324, 325. As explained above, this will not be able to change the node voltage. But now the reduction of CMFB2 will also reduce the current through NMOS current source device 462 This in turn will cause PMOS devices 460, 461 to reduce current flow to bias device 310, which in turn causes cascode devices 322, 323 to reduce their current flow, as illustrated by dotted line 470. This causes the voltage on control signals INT_M and INT_P to rise and thereby bring output devices 340, 341 out of saturation.

Once correct operation of output devices 340, 341 is restored, common mode signal CMS2 returns to approximately 0.7 volts in response to the correct operation of common mode feedback signal CMFB2 and common mode feedback devices 324, 325. As common mode signal CMS2 returns to approximately 0.7 volts, common mode feedback signal CMFB2 rises and returns current source bias device 462 to its normal design point operation and thereby restores common mode bias device 310 and cascode devices 322, 323 to their normal design point operation.

Thus, under start-up failure, cascode devices 322, 323 regain control over main current mirrors 320, 321 and work as if there is 100% common mode feedback. Once amplifier 100 has started up and is operating correctly, there is no additional power dissipation as a result of common mode feedback signal CMFB being coupled to the gate of current source bias device 462. Thus, correct reliable start up operation is assured with no additional power dissipation or reduction in amplification performance or stability.

Current mirror devices 460-462 are used during normal operation of amplifier 100 to provide a defined current to cascode bias device 310, in a similar manner as current source 312 in amplifier 200. Thus, using current mirror devices 460-462 to provide common mode feedback during start-up to cascode devices 322-323 may require few or no additional transistor devices.

Figure 5:
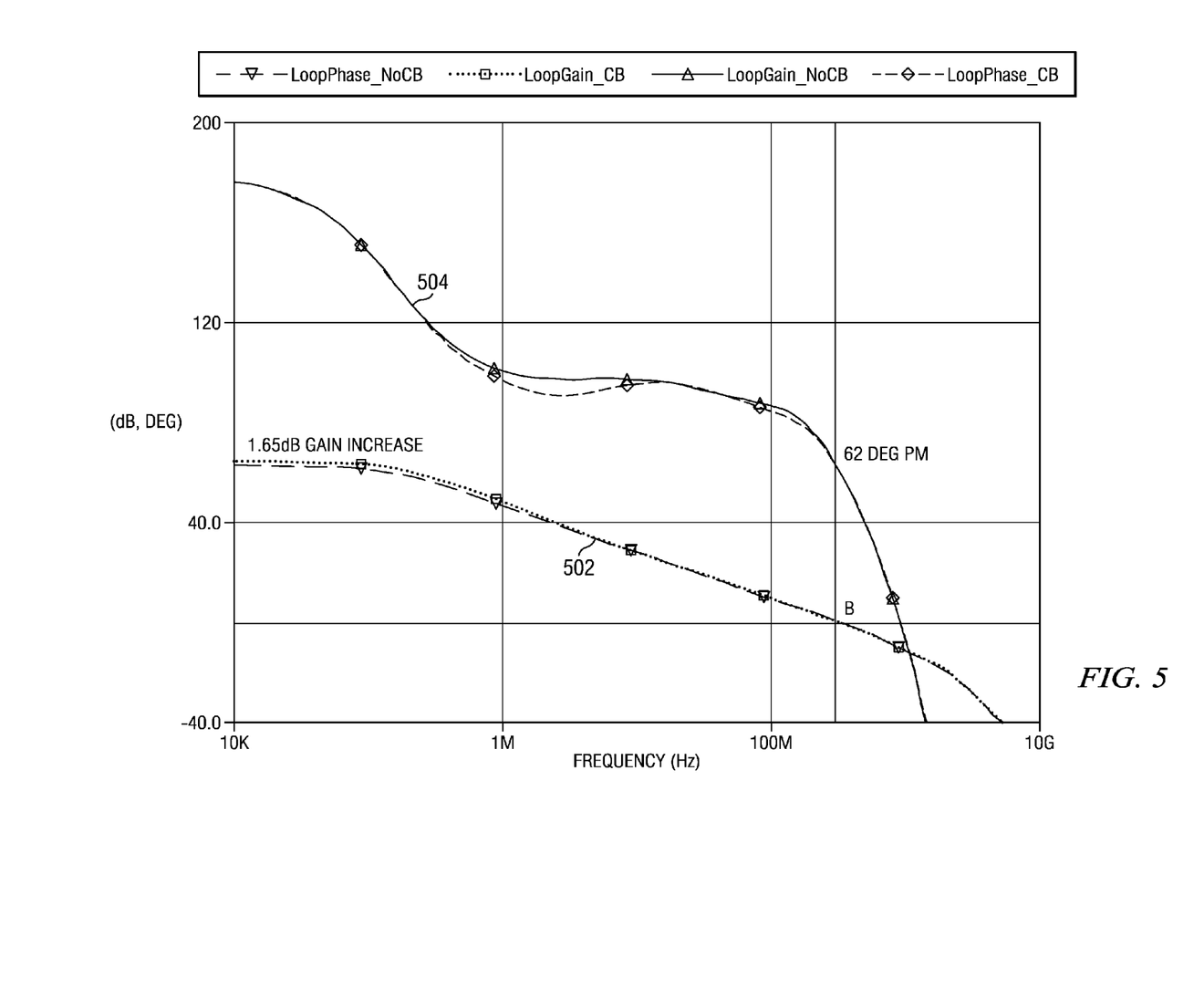
FIG. 5 is a set of plots which indicates that the stability of the common mode feedback circuit does not degrade after applying the improved common mode feedback architecture.

FIG. 5 is a set of plots illustrating performance of common mode loop structure of amplifier 100 with common mode feedback (CB) to cascode devices 322, 323 as compared to prior art amplifier 200 that does not have common mode (NoCB) feedback to cascode devices 322, 323. For both amplifiers, common mode loop gain curves 502 and common mode loop phase curves 504 are essentially identical. The phase margin (PM) of the common mode loop curve 504 indicates negligible change in loop phase curve due to the addition of parallel common mode feedback path through device 460-462. Therefore, there is no oscillation risk.

Figure 6:
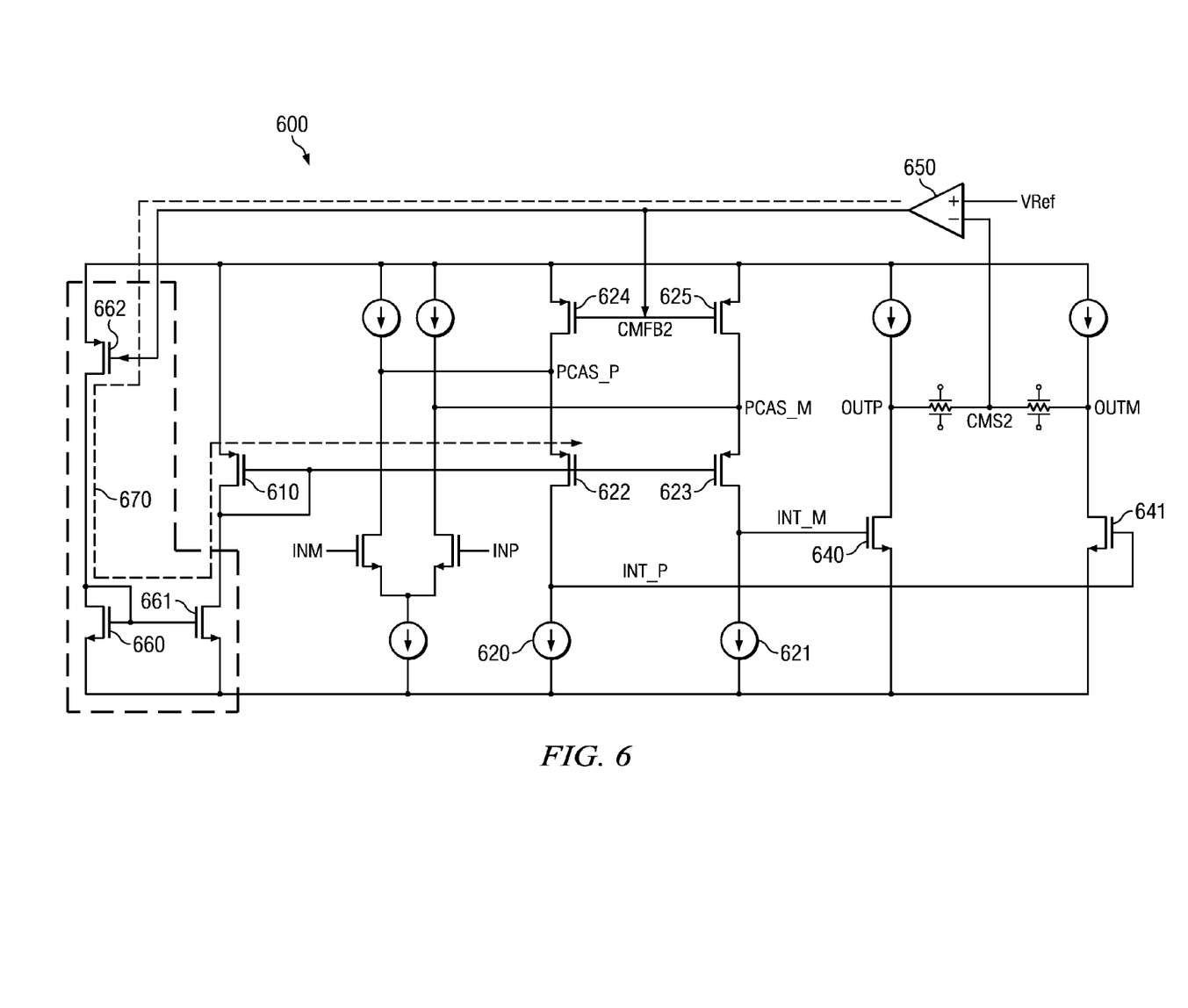
FIG. 6 is a schematic of another embodiment in which common mode feedback is applied to PMOS cascode devices.

FIG. 6 is a schematic of another embodiment of the invention in which common mode feedback is applied to PMOS cascode devices 622, 623 of differential amplifier 600, as illustrated by dotted line 670

During start-up, if common mode signal CMS2 gets stuck at 0.0V due to output devices 640, 641 erroneously saturating as described in the above example, then as in the previous example the common mode feedback amplifier 650 tries to increase the voltage at node CMFB2 in an attempt to reduce current through devices 624, 625. As explained above, this will not be able to change the node voltage. However, the reduction of CMFB2 will also reduce the current through PMOS current source device 662 This in turn will cause NMOS devices 660, 661 to reduce current flow to bias device 610, which in turn causes cascode devices 622, 623 to reduce their current flow, as illustrated by dotted line 670. This causes the voltage on control signals INT_M and INT_P to lower and thereby bring output devices 640, 641 out of saturation.

Once correct operation of output devices 640, 641 is restored, common mode signal CMS2 returns to approximately 0.7 volts in response to the correct operation of common mode feedback signal CMFB2 and common mode feedback devices 624, 625. As common mode signal CMS2 returns to approximately 0.7 volts, the voltage on common mode feedback signal CMFB2 reduces and returns current source bias device 662 to its normal design point operation and thereby restores common mode bias device 610 and cascode devices 622, 623 to their normal design point operation.

Thus, under start-up failure, cascode devices 622, 623 regain control over main current mirrors 620, 621 and work as if there is 100% common mode feedback. Once amplifier 600 has started up and is operating correctly, there is no additional power dissipation as a result of common mode feedback signal CMFB being coupled to the gate of current source bias device 662. Thus, correct reliable start up operation is assured with no additional power dissipation or reduction in amplification performance or stability.

Figure 7:
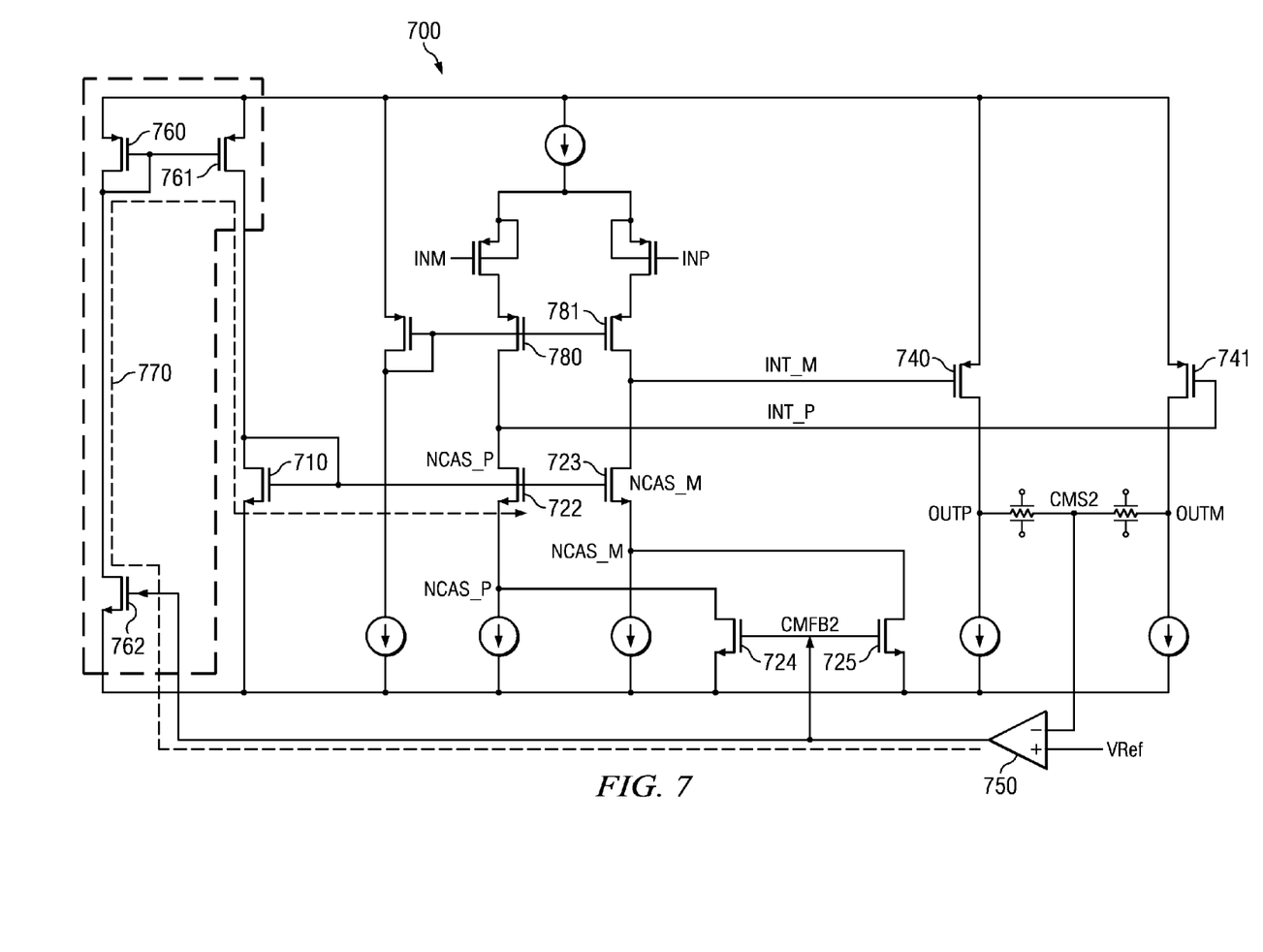
FIG. 7 is a schematic of another embodiment of an amplifier with common mode feedback through cascode devices.

FIG. 7 is a schematic of an amplifier 700 in which a different architecture is used for the main amplifier and the common mode feedback through cascode device technique is applied to assure correct start up.

During start-up, if common mode signal CMS2 gets stuck at 1.5V due to output devices 740, 741 erroneously saturating as described in the above example, then as in the previous example the common mode feedback amplifier 750 tries to reduce the voltage at node CMFB2 in an attempt to reduce current through devices 724, 725. As explained above, this will not be able to change the node voltage. But now the reduction of CMFB2 will also reduce the current through NMOS current source device 762 This in turn will cause PMOS devices 760, 761 to reduce current flow to bias device 710, which in turn causes cascode devices 722, 723 to reduce their current flow, as illustrated by dotted line 770. This causes the voltage on control signals INT_M and INT_P to rise and thereby bring output devices 740, 741 out of saturation.

Once correct operation of output devices 740, 741 is restored, common mode signal CMS2 returns to approximately 0.7 volts in response to the correct operation of common mode feedback signal CMFB2 and common mode feedback devices 724, 725. As common mode signal CMS2 returns to approximately 0.7 volts, common mode feedback signal CMFB2 rises and returns current source bias device 762 to its normal design point operation and thereby restores common mode bias device 710 and cascode devices 722, 723 to their normal design point operation.

Thus, under start-up failure, cascode devices 722, 723 regain control over the complete current flowing through cascode devices 780, 781 and work as if there is 100% common mode feedback. Once amplifier 700 has started up and is operating correctly, there is no additional power dissipation as a result of common mode feedback signal CMFB being coupled to the gate of current source bias device 762. Thus, correct reliable start up operation is assured with no additional power dissipation or reduction in amplification performance or stability.

Figure 8:
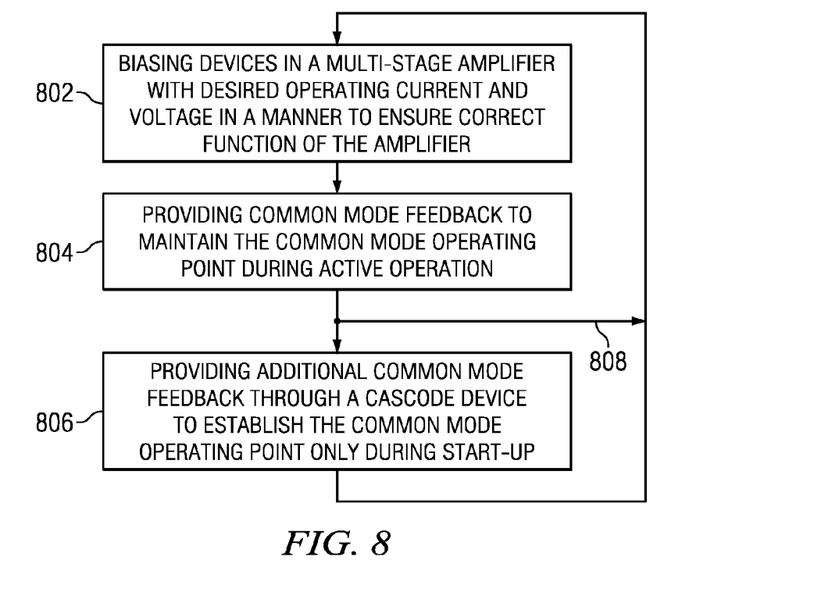
FIG. 8 is a flow chart illustrating operation of improved common mode feedback through cascode devices of a differential amplifier.

FIG. 8 is a flow chart illustrating operation of amplifier 100 of FIG. 1 and FIG. 4. The amplifiers illustrated in FIG. 6 and in FIG. 7 operate in a similar manner. As discussed above, amplifier 100 is biased 802 at a desired operation point. Referring again to FIG. 4, this is done in this example using bias devices 460-462 and 310.

Common mode feedback is provided 804 to maintain the common mode operating point during active operation. This is provided by feedback devices 324, 325 that are controlled by common mode feedback signal CMFB2 which is derived from common mode signal CMS2 that is coupled to the output terminals OUTP and OUTM via resistors 342, 343.

Additional common mode feedback is provided 806 to the cascode coupled devices 322, 323 via the biasing devices 460-461 and 310 to establish the common mode operating point during start-up. This may be done by directly connecting common mode feedback signal CMFB2 to the control terminal of bias device 462.

The additional common mode feedback is negligible after start-up, as indicated at 808. This is because once operating point voltages reach their desired level, the cascode devices 322, 323 go back to their normal operation when the current sources 305, 306 and feedback devices 324, 325 regain control over the current flowing in the amplifier.

System Usage

Many types of systems that use differential amplifiers may benefit from using amplifiers that embody the current invention due to more failsafe operation and reduced power consumption.

Systems that may use amplifiers embodying the invention described herein may be virtually any type of digital system or analog system, such as a desk top computer, a laptop computer, a digital video recorder, a handheld device such as a mobile phone, a personal digital assistant, a video camera, an MP3 player, an iPod, various automotive and industrial control systems, etc.

Other Embodiments

While the invention has been described with reference to illustrative embodiments, this description is not intended to be construed in a limiting sense. Various other embodiments of the invention will be apparent to persons skilled in the art upon reference to this description. For example, many types of existing amplifier designs may be improved by adding common mode feedback as described herein. In particular, multi-stage op-amp designs are particularly subject to start-up latching, which may be controlled by embodiments of the present invention.

Embodiments of the present invention are useful for low power amplifiers designs since the common mode feedback to cascode scheme does not cause any additional power consumption and requires only a few, if any, additional transistor devices.

There is no overdesign or risk of stability as the job of a typical common mode feedback amplifier which is usually present in these types of amplifier structures is simply extended without any increased performance requirement.

While a low power amplifier operating on 1.5 v has described herein, embodiments of the invention may include amplifiers that operate on higher, or on even lower supply voltages. Embodiments of the invention may also include amplifiers that operate on a negative supply voltage. While amplifiers implemented in CMOS (complimentary metal on silicon) have been described herein, embodiments of the invention are not limited to CMOS process technology.

Feedback through cascode devices may be directly applied in some cases. In such configurations, the biasing devices such as 460-462 and 310 may be bypassed (or not present) to provide common mode feedback to cascode devices.

In some embodiments, there may be configurations in which there is more biasing or an analog processing stage from the amplifier 350 to the gate of device 324, 325, for example.

It is possible to have this problem in multi-stage amplifiers having more than two stages. In such multistage amplifiers, feedback through cascode devices may be applied in more than one stage to prevent incorrect startup.

Feedback through a cascode device may also be used in a non-differential amplifier to prevent startup problems.

Certain terms are used throughout the description and the claims to refer to particular system components. As one skilled in the art will appreciate, components in amplifier designs may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

It is therefore contemplated that the appended claims will cover any such modifications of the embodiments as fall within the true scope and spirit of the invention.

What is claimed is:

1. A method for operating a differential amplifier having a first stage with a cascode device, the method comprising:
   biasing the cascode device to establish a quiescent common mode operating point in the amplifier;
   providing common mode feedback to the first stage to maintain the quiescent common mode operating point during active operation; and
   providing additional common mode feedback to the cascode device to establish the quiescent common mode operating point during start-up.

2. The method of claim 1, wherein providing additional common mode feedback is negligible after start-up.

3. The method of claim 1, wherein providing additional common mode feedback to the cascode device is provided via biasing the cascode device.

4. The method of claim 1, wherein there are multiple cascode stages and wherein providing additional common mode feedback to cascode devices is provided to more than one cascode stage.

5. A system comprising a differential amplifier, wherein the differential amplifier comprises:
   a first stage with cascode devices;
   a second stage controllably coupled to the cascode devices;
   a biasing circuit coupled to control inputs of the cascode devices configured to establish a quiescent common mode operating point;
   a common mode feedback circuit coupled to the cascode devices configured to maintain the quiescent common mode operating point during active operation; and
   an additional common mode feedback circuit coupled to control inputs of the cascode devices operable to establish the quiescent common mode operating point during start-up.

6. The amplifier of claim 5, wherein the additional common mode feedback circuit is connected to the cascode devices via the biasing circuit.

7. An amplifier comprising:
   a first stage with a first semiconductor device having a control terminal for an input signal;
   a cascode device coupled to the first semiconductor device;
   a second stage with a second semiconductor device controllably coupled to the cascode device, the second stage having an output terminal coupled to the second semiconductor device;
   biasing circuitry coupled to a control input of the cascode device, wherein the biasing circuitry is configured to establish a quiescent output voltage for the amplifier; and
   wherein the biasing circuitry is controllably coupled to a feedback signal derived from a signal on the output terminal.

8. The amplifier of claim 7, further comprising a feedback semiconductor device coupled to the cascode device, wherein the feedback signal is coupled to a control terminal of the feedback semiconductor device.

9. The amplifier of claim 8 being a differential amplifier, wherein the quiescent output voltage is a quiescent common mode voltage.

\* \* \* \* \*